(12) United States Patent
Suib et al.

(10) Patent No.: US 11,352,699 B2
(45) Date of Patent: Jun. 7, 2022

(54) TUNGSTEN BRONZE THIN FILMS AND METHOD OF MAKING THE SAME

(71) Applicant: University of Connecticut, Farmington, CT (US)

(72) Inventors: Steven L. Suib, Storrs, CT (US); Niluka D. Wasalathanthri, Storrs, CT (US); David A. Kriz, Storrs, CT (US); Madhavi N. Pahalagedara, Storrs, CT (US); Wimalika Thalgaspitiya, Vernon, CT (US); Dinithi Rathnayake, Storrs, CT (US)

(73) Assignee: UNIVERSITY OF CONNECTICUT, Farmington, CT (US)

(*) Notice: Subject to any disclaimer, the term of this patent is extended or adjusted under 35 U.S.C. 154(b) by 299 days.

(21) Appl. No.: 16/421,128

(22) Filed: May 23, 2019

(65) Prior Publication Data

US 2020/0370181 A1 Nov. 26, 2020

(51) Int. Cl.
*C01G 41/02* (2006.01)
*C23C 18/08* (2006.01)
(Continued)

(52) U.S. Cl.
CPC .............. *C23C 18/08* (2013.01); *B32B 15/01* (2013.01); *B32B 15/20* (2013.01); *C23C 18/127* (2013.01); *C23C 18/1241* (2013.01); *C23C 18/1275* (2013.01); *C01G 41/00* (2013.01); *C01G 41/02* (2013.01); *C23C 18/04* (2013.01); *C23C 18/12* (2013.01); *C23C 18/1216* (2013.01);
(Continued)

(58) Field of Classification Search
CPC ... C23C 18/08; C23C 18/1241; C23C 18/127; C23C 18/1275; C23C 18/12; C23C 24/04; C23C 18/04; C23C 18/1216; B32B 15/01; B32B 15/20; Y10T 428/24413; C01G 41/02; C01G 41/00; C09D 4/02; C09D 5/32; C30B 29/22; H01B 1/08
USPC ........................................................ 428/148
See application file for complete search history.

(56) References Cited

U.S. PATENT DOCUMENTS

| | | |
|---|---|---|
| 3,457,106 A | 7/1969 | Gillery |
| 3,505,108 A | 4/1970 | Mochel |
| (Continued) | | |

FOREIGN PATENT DOCUMENTS

| | | | | |
|---|---|---|---|---|
| CN | 107601568 A | * | 1/2018 | ............ C01G 41/02 |
| CN | 109677083 A | * | 4/2019 | ............ B32B 27/36 |
| (Continued) | | | | |

OTHER PUBLICATIONS

S.H. Bae et al. "Effect of Surface Roughness and Electroless Ni—P Plating on the Bonding Strength of Bi—Te-based Thermoelectric Modules" Feb. 2019, Coatings, 9, 213, p. 1-8. (Year: 2019).*
(Continued)

*Primary Examiner* — Humera N. Sheikh
*Assistant Examiner* — John D Schneible
(74) *Attorney, Agent, or Firm* — Casimir Jones S.C.; Lisa Mueller

(57) ABSTRACT

The present disclosure relates to tungsten bronze thin films and method of making the same. Specifically, the present disclosure relates to a thin, homogeneous, highly conducting cubic tungsten bronze film with densely packed micron size particles and the process of making the film.

17 Claims, 2 Drawing Sheets

(51) Int. Cl.
| | |
|---|---|
| *B32B 15/01* | (2006.01) |
| *C23C 18/12* | (2006.01) |
| *B32B 15/20* | (2006.01) |
| C23C 24/04 | (2006.01) |
| H01B 1/08 | (2006.01) |
| C01G 41/00 | (2006.01) |
| C23C 24/00 | (2006.01) |
| C30B 29/22 | (2006.01) |
| C23C 18/04 | (2006.01) |

(52) U.S. Cl.
CPC .......... *C23C 18/1245* (2013.01); *C23C 24/00* (2013.01); *C23C 24/04* (2013.01); *C30B 29/22* (2013.01); *H01B 1/08* (2013.01); *Y10T 428/24413* (2015.01)

(56) References Cited

U.S. PATENT DOCUMENTS

| | | | |
|---|---|---|---|
| 4,232,097 A * | 11/1980 | Shanks .................. | H01M 4/92 429/44 |
| 7,708,974 B2 | 5/2010 | Yadav | |
| 10,120,106 B2 | 11/2018 | Shen et al. | |
| 11,208,563 B2 * | 12/2021 | Tsunematsu ............. | G02B 5/24 |
| 2007/0187653 A1 * | 8/2007 | Takeda ................ | C01G 41/006 252/500 |
| 2010/0102700 A1 * | 4/2010 | Jaiswal ................ | C01G 41/00 313/311 |
| 2015/0104637 A1 * | 4/2015 | Watanabe ............ | H01L 29/516 |

FOREIGN PATENT DOCUMENTS

| | | | | |
|---|---|---|---|---|
| CN | 208801693 U | * | 4/2019 | ........... H01L 29/516 |
| JP | H-0873223 A | * | 3/1996 | ............ C01G 19/00 |

OTHER PUBLICATIONS

C.J. Raub et al. "Superconductivity of Sodium Tungsten Bronzes", Dec. 1964, Physical Review Letters, 13, 25, p. 746. (Year: 1964).*

N.N. Garif'yanov et al. "Superconductivity of sodium tungsten bronze with cubic structure", Aug. 1996, Proceedings of the 21st International Conference on Low Temperature Physics, 46, p. 855-856. (Year: 1996).*

A.M. El-Sayed et al. "Some properties of sodium tungsten bronzes as a function of sodium concentration", May 2005, Indian Journal of Chemical Technology, 12, p. 304-308. (Year: 2005).*

L. Tegg et al. "Bulk scale fabrication of sodium tungsten bronze nanoparticles for applications in plasmonics" Jul. 2018, Nanotechnology Letters, 2018, 29, p. 1-6. (Year: 2018).*

L. Tegg et al. "The sodium tungsten bronzes as plasmonic materials: fabrication, calculation and characterization" Jun. 2017, Materials Research Express, 2017, 4, p. 1-16. (Year: 2017).*

W.H. Lee et al. "Increased Environmental Stability of a Tungsten Bronze NIR-absorbing Window" Jul. 2013, Fibers and Polymers, 14, 12, p. 2077-2082. (Year: 2013).*

I.J. McColm et al. "The Reaction of Cubic Sodium Tungsten Bronzes, Na,WO3, with Metallic Iron" Aug. 1979, Journal of Solid State Chemistry, 34, p. 167-181. (Year: 1979).*

S.Y. Lee et al. "Facile fabrication of high-efficiency near-infrared absorption film with tungsten bronze nanoparticle dense layer" Jun. 2014, 9, 294, p. 1-8. (Year: 2014).*

A.J. Appleby et al. "Behavior of Pure and Platinum-Doped Sodium Tungsten Bronze Electrodes in Oxygen-Saturated Phosphoric Acid" Feb. 1976, 123, 2, p. 200-203. (Year: 1976).*

M. Miyakawa et al. "Large electrical conductivity enhancement of WO3 thin films produced by ion implantation", 1998, Journal of Applied Physics, 84, p. 5610 (Year: 1998).*

B.W. Brown et al. "Conductivity of the Sodium Tungsten Bronzes", 1951, Physical Reviews, 84, p. 609 (Year: 1951).*

E. O. Brimm et al., "Sodium and Potassium Tungsten Bronzes", JACS 73, 5427-5432, (1951).

I. Lekshmi et al., "Synthesis and electrical properties of cubic NaxWO3 thin films across the metal-insulator transition", Materials Research Bulletin 40, 1443-1450 (2005).

J. Murdzek, "The Optimization of the Microwave Synthesis and Subsequent Characterization of Sodium Tungsten Bronze (NaxWO3) Materials", The University of Connecticut Honors Scholar Theses (2017).

* cited by examiner

TUNGSTEN BRONZE THIN FILMS AND METHOD OF MAKING THE SAME

BACKGROUND OF THE INVENTION

1. Field of the Discovery

The present disclosure relates to tungsten bronze thin films and method of making the same. Specifically, the present disclosure relates to a thin, homogeneous, highly conducting cubic tungsten bronze film and the process of making the film.

2. Background Information

Tungsten bronzes are neither alloys nor intermetallic compounds. The term bronze was originally applied to describe the yellow, metallic bronze-like luster of $Na_xWO_3$ where x is about 0.8 or 0.9. However, the term is now applied generally to this type of composition regardless of color, and x is broadly defined as equal to or less than 1. Tungsten bronzes have electrical properties range from semiconducting to metallic depending on the concentration of sodium ions present; it can also exhibit superconductivity.

Different methods has been used in forming tungsten bronze thin films on a substrate. For example, Lekshmi et al., Materials Research Bulletin 40 (2005) 1443-1450, discloses $Na_xWO_3$ thin films that were fabricated in the composition range $0.1 \leq x \leq 0.46$ by pulsed laser deposition technique. The tungsten bronze thin film using this method has a thickness of about 300 nm, with particle size less than 1μm in size, and conductivity of $8.1 \times 10^7$ S/m for the film with x=0.46, with conductivity generally increasing as the x value increasing from 0.15 to 0.46.

Brimm et al., Journal of American Chemical Society, 73:110 (1951), 5427-5432, discloses a method for preparing a series of sodium-potassium tungsten bronzes of violet color and tetragonal structure. The method includes heating a mixture of sodium tungstate, potassium tungstate, tungsten (VI) oxide and tungsten one hour at 1000° C. in a vacuum or argon atmosphere. The melt was cooled to room temperature over a period of two hours. However, the products of this method includes metallic tungsten that remains as an impurity in the bronze after the usual purification steps, and no method was found to remove this free tungsten without destroying the bronze.

U.S. Pat. No. 3,505,108 discloses a thin (less than about 5 microns in thickness of an alkali metal tungsten bronze), continuous, polycrystalline haze-free film that was produced by a solution slurry method. In details, an alkali-metal tungsten bronze film is formed on a substrate material by applying to the substrate, a coating of a solution of a salt of an acid of tungsten and an inorganic compound of an alkali metal, and firing in a reducing atmosphere at a temperature between about 400 and 650° C.

U.S. Pat. No. 3,457,106 discloses the method of producing metal-tungsten bronze films by reacting a thin, tungsten oxide film previously applied to a refractory substrate with a metal (e.g. Na) in a substantially oxygen free environment at a temperature in the range of 480 to 650° C. to react the metal with the polycrystalline tungsten oxide film structure. The film produced in accordance with this method is polycrystalline. In addition, the thickness of the tungsten bronze film is limited by the diffusing of the Na ions through the tungsten oxide film, and Na is not uniformly dispersed through film.

U.S. Pat. No. 7,708,974 discloses the method for making tungsten bronze nanoparticles by drying a solution or slurry of a mixture at high temperature. Particles of mean crystallite size less than 1 micron, or less than 100 nm, was produced using various methods including plasma processes, combustion in air, combustion in purified oxygen or oxygen rich gases, combustion with oxidants, pyrolysis, electrical arcing in an appropriate reactor, and combinations thereof, all requires a temperature of 1200° C. or higher. The nanoparticles can be used to produce a film by electrophoretic deposition, magnetophorectic deposition, spin coating, dip coating, spraying, brushing, screen printing, ink-jet printing, toner printing, and sintering.

However, sodium tungsten bronze deposition techniques that involved with hydrothermal method or sol gel methods are unable to produce cubic phases of sodium tungsten bronzes that is the highly conducting phase. Thermal evaporation methods are employed to obtained sodium tungsten bronze thin film on glass, non-conducting ceramic, or glass-ceramic substrates. None of the current methods is able to produce sodium tungsten bronze films with micron size particles and higher conductivity. In addition, Thermal evaporation techniques are complex, expensive, and special instrumentation are required.

Therefore, there is a need to produce a tungsten bronze film with higher conductivity, higher degree of crystalline purity, improved thickness (e.g., above 100μm), and higher chemical purity.

BRIEF SUMMARY OF THE INVENTION

The present disclosure relates to tungsten bronze thin films and/or method of making the same. Specifically, the present disclosure relates to a thin, homogeneous, highly conducting cubic tungsten bronze film and the process of making the film.

In one aspect, the invention provides a tungsten bronze film comprising densely packed micron size particles. Specifically, the invention provides a tungsten bronze film that has a film thickness in the range of 0.01 mm to 2 mm, and the densely packed micron size particles have a particle size in the range of 0.04μm-10μm.

The alkali metal in the tungsten bronze film is not limited. In certain embodiments, the tungsten bronze film has a chemical formula of $Li_xWO_3$, $Na_xWO_3$, $K_xWO_3$, and $Cs_xWO_3$. In a specific embodiment, the tungsten bronze film is $Na_xWO_3$.

The amount of alkali metal in the tungsten bronze film is also not limited. In certain embodiments, the amount of alkali metal, x, in the tungsten bronze film is 0.4 or higher and 1 or lower. In certain embodiments, x is 0.75 or higher and 0.85 or lower.

In one aspect, the invention provides a tungsten bronze film with high conductivity. In certain embodiments, the tungsten bronze film has a conductivity of $1 \times 10^7$ S/m or higher. In certain embodiments, the tungsten bronze film has a conductivity of $1 \times 10^8$ S/m or higher. In certain embodiments, the tungsten bronze film has a conductivity of $3 \times 10^8$ S/m or higher. In certain embodiments, the tungsten bronze film has a conductivity of $5 \times 10^8$ S/m or higher.

In one aspect, the tungsten bronze film further includes a dopant. The dopant in the tungsten bronze film is not limited, and the dopant is selected from any transition metal including elements in the d-block of the periodic table, which includes groups 3 to 12 on the periodic table. In certain embodiments, the transition metal is selected from the f-block of the periodic table. In certain specific embodiments, the dopant is Fe, Ni, Co, and/or Ag.

In one aspect, the invention provides a tungsten bronze film with high cubic crystalline phase purity. In certain embodiments, the cubic crystalline phase purity of tungsten bronze film is 90% or higher, 95% or higher, 98% or higher, or 99% or higher. In one aspect, the method to characterize the cubic crystalline phase purity of tungsten bronze film is not particularly limited. In a specific embodiment, the cubic crystalline phase purity of tungsten bronze film is characterized by powder x-ray diffraction pattern, which is well known in the literature.

In one aspect, the invention provides a tungsten bronze film that is deposited on a substrate, and the substrate is not specifically limited. In certain embodiments, the substrate is copper, glass, steel, porcelain, alumina, iron, or a mixture thereof. In certain embodiments, the substrate may also have a finish which is not specifically limited. In certain embodiments, the finish is Cu, Ag, Ni, Al, Sn, or an alloy thereof. In one specific embodiment, the substrate is copper. In certain embodiments, the substrate is a metal coated or a plated substrate, wherein the metal coating or plating metal is not specifically limited, and can be selected from Cu, Ag, Ni, Al, Sn, or an alloy thereof. In certain embodiments, the metal coated substrate or plated substrate is a patterned substrate.

In one aspect, the present invention is also directed to the process of producing the tungsten bronze film by heating a mixture of alkaline tungstate, tungsten (VI) oxide $WO_3$), tungsten powder in a furnace under inert atmosphere at 700-1000° C.

In certain embodiments, the process of producing the tungsten bronze film includes the steps of, mixing an alkaline tungstate, tungsten (VI) oxide $WO_3$), tungsten powder, and a solvent to form a slurry; dispensing the slurry onto a surface of a substrate; and heating the substrate with the slurry in a furnace under inert atmosphere at 700-1000° C. for 0.5-10 hours.

In certain embodiments, the process of producing the tungsten bronze film includes the step of cleaning the surface of the substrate before dispensing the slurry onto the surface.

In certain embodiments, the process of producing the tungsten bronze film includes the use of sodium tungstate, potassium tungstate, and/or cesium tungstate.

In certain embodiments, the process of producing the tungsten bronze film includes the steps of, mixing an alkaline tungstate, tungsten (VI) oxide $WO_3$), tungsten powder, and a solvent to form a slurry; sonicating the slurry; dispensing the slurry onto a surface of a substrate; and heating the substrate with the slurry in a furnace under inert atmosphere at 700-1000° C. for 0.5-10 hours.

In certain embodiments, the process of producing the tungsten bronze film includes adding a dopant to the mixture of alkaline tungstate, tungsten (VI) oxide $WO_3$), tungsten powder. The dopant is not particularly limited, and can be selected from any transition metal including elements in the d-block of the periodic table, which includes groups 3 to 12 on the periodic table. In certain embodiments, the transition metal is selected from the f-block of the periodic table. In certain specific embodiments, the dopant is Fe, Ni, Co, and/or Ag.

In one aspect, the invention provides a coated substrate comprising a substrate and a tungsten bronze film having densely packed micron size particles, wherein the film thickness in the range of 100µm to 2 mm, the densely packed micron size particles have a particle size in the range of 45 nm-10µm, and the purity of cubic phase of tungsten bronze film is 90% or higher, and wherein the tungsten bronze film is prepared by heating a mixture comprising alkaline tungstate, tungsten (VI) oxide $WO_3$), and tungsten powder in a furnace under inert atmosphere at 700-1000° C.

In one aspect, the invention provides the method of using the coated substrate.

Further objects, aspects, embodiments, features and advantages of the present disclosure will be understood by reference to the following drawings and detailed description.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating an embodiment of the invention and are not to be construed as limiting the invention. Further objects, features and advantages of the invention will become apparent from the following detailed description taken in conjunction with the accompanying figures showing illustrative embodiments of the invention, in which.

DETAILED DESCRIPTION OF THE INVENTION

Figure 1:
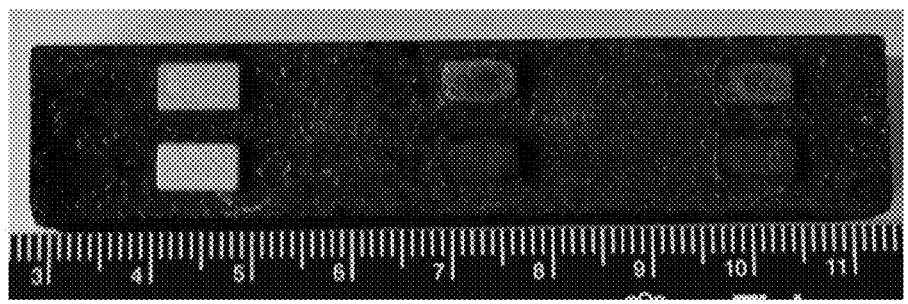
FIG. 1 provides a photographic image of deposited Cu substrates on graphite block.

The following is a detailed description provided to aid those skilled in the art in practicing the present disclosure. Those of ordinary skill in the art may make modifications and variations in the embodiments described herein without departing from the spirit or scope of the present disclosure. All publications, patent applications, patents, figures and other references mentioned herein are expressly incorporated by reference in their entirety.

Unless otherwise defined, all technical and scientific terms used herein have the same meaning as commonly understood by one of ordinary skill in the art to which this disclosure belongs. The terminology used in the description is for describing particular embodiments only and is not intended to be limiting of the disclosure.

Where a range of values is provided, it is understood that each intervening value, to the tenth of the unit of the lower limit unless the context clearly dictates otherwise (such as in the case of a group containing a number of carbon atoms in which case each carbon atom number falling within the range is provided), between the upper and lower limit of that range and any other stated or intervening value in that stated range is encompassed within the disclosure. The upper and lower limits of these smaller ranges may independently be included in the smaller ranges is also encompassed within the disclosure, subject to any specifically excluded limit in the stated range. Where the stated range includes one or both of the limits, ranges excluding either both of those included limits are also included in the disclosure.

All numerical values within the detailed description and the claims herein are modified by "about" or "approximately" the indicated value, and take into account experimental error and variations that would be expected by a person having ordinary skill in the art.

The following terms are used to describe the present disclosure. Unless otherwise defined, all technical and scientific terms used herein have the same meaning as commonly understood by one of ordinary skill in the art to which this disclosure belongs. The terminology used in the description is for describing particular embodiments only and is not intended to be limiting of the disclosure.

The articles "a" and "an" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

In the claims, as well as in the specification, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein in the specification and in the claims, the phrase "substrate" should be understood to mean a refractory material or a metal. The phrase "refractory material" should be understood to mean a heat-resistant material, e.g. a mineral that is resistant to decomposition by heat, pressure, or chemical attack, most commonly applied to a mineral that retains strength and form at high temperatures. The refractory material includes, but not limited to, clay, glass, ceramics, alumina, silica, magnesia, lime, zirconia, silicon carbide, graphite, tungsten carbide, boron nitride, hafnium carbide, or the like.

Tungsten Bronze Film

The invention discloses here is applicable not only to glass, ceramic substrates but also to any heat resistant substrates including metals (Cu, Al). Furthermore, the conductivities of the films are extremely high and the procedure is simple, low cost, and rapid compared to the thermal evaporation techniques. The invention discloses a coated substrate comprised of a substrate and a thin, homogeneous, highly conducting cubic sodium tungsten bronze film firmly adhered to a surface thereof and the process of making the film. The substrate of the present disclosure is not specifically limited. In certain embodiments, the substrate is a refractory material, a metal, or a mixture thereof, with or without an additional finish. In certain embodiments, the substrate is a metal coated substrate or a plated substrate, wherein the plating metal is not specifically limited, and can be selected from Cu, Ag, Ni, Al, Sn, or an alloy thereof. In certain embodiments, the metal coated substrate or plated substrate is a patterned substrate.

In one aspect, the invention provides a tungsten bronze film comprising densely packed micron size particles. Specifically, the invention provides a tungsten bronze film that has a film thickness in the range of 0.01 mm to 2 mm, and the densely packed micron size particles have a particle size in the range of 0.04µm-10µm. In certain embodiments, the invention provides a tungsten bronze film that has a film thickness in the range of 0.05 mm to 2 mm, or 0.1 mm to 2 mm. In certain embodiments, the densely packed micron size particles have a particle size in the range of 0.045µm to 10µm, or 0.045µm to 5µm. The alkali metal in the tungsten bronze film is not limited. In certain embodiments, the tungsten bronze film has a chemical formula of $Li_xWO_3$, $Na_xWO_3$, $K_xWO_3$, and $Cs_xWO_3$. In a specific embodiments, the tungsten bronze film is $Na_xWO_3$. The amount of alkali metal (x) in the tungsten bronze film is in the range from 0 to 1. In certain embodiments, x is in 0.4 or higher and 1 or lower. In certain embodiments, the amount of alkali metal, x, in the tungsten bronze film is in 0.75 or higher and 0.85 or lower.

In one aspect, the invention provides a tungsten bronze film with high conductivity. In certain embodiments, the tungsten bronze film has a conductivity of $1 \times 10^7$ S/m or higher. In certain embodiments, the tungsten bronze film has a conductivity of $5 \times 10^7$ S/m or higher. In certain embodiments, the tungsten bronze film has a conductivity of $1 \times 10^8$ S/m or higher. In certain embodiments, the tungsten bronze film has a conductivity of $3 \times 10^8$ S/m or higher. In certain embodiments, the tungsten bronze film has a conductivity of $5 \times 10^8$ S/m or higher.

In one aspect, the tungsten bronze film further includes a dopant. The dopant in the tungsten bronze film is not limited, and the dopant is selected from any transition metal including elements in the d-block of the periodic table, which includes groups 3 to 12 on the periodic table. In certain embodiments, the transition metal is selected from the f-block of the periodic table. In certain specific embodiments, the dopant is Fe, Ni, Co, and/or Ag.

In one aspect, the invention provides a tungsten bronze film with high cubic crystalline phase purity. In certain embodiments, the cubic crystalline phase purity of tungsten bronze film is 90% or higher, 95% or higher, 98% or higher, or 99% or higher. In one aspect, the method to characterize the cubic crystalline phase purity of tungsten bronze film is not particularly limited. In a specific embodiment, the cubic crystalline phase purity of tungsten bronze film is characterized by powder x-ray diffraction pattern, which is well known in the literature.

In one aspect, the invention provides a tungsten bronze film that is deposited on a substrate, and the substrate is not specifically limited. In certain embodiments, the substrate is copper, glass, steel, ceramics, alumina, iron, or a mixture thereof. In one specific embodiment, the substrate is copper. In certain embodiments, the substrate may also have a finish which is not specifically limited. In certain embodiments, the finish is Cu, Ag, Al, Ni, Sn, or an alloy thereof. In certain embodiments, the substrate is a metal coated substrate or a plated substrate, wherein the coating metal or plating metal is not specifically limited, and can be selected from Cu, Ag, Ni, Al, Sn, or an alloy thereof. In certain embodiments, the metal coated substrate or plated substrate is a patterned substrate.

Process for Making the Tungsten Bronze Film

An in-situ synthesis process is provided, which involves depositing a precursor dispersed in a variety of solvents. The precursor dispersion includes precursors such as alkali tungstate, tungsten (VI) oxide, tungsten powder, optionally a dopant (e.g., iron), and a solvent or solvent mixture such as distilled deionized water, ethanol and/or dimethyl sulfoxide. The substrate can be any heat-resistant material such as glass, ceramics and metals. The precursor deposition can be done using a glass Pasteur pipette, under atmospheric air. The deposition temperature is varied depending on the solvent and dimethyl sulfoxide is found to be the best solvent. Alkali tungsten bronze (cubic phase) films are obtained by heating the precursor deposited substrates under an inert atmosphere at 700-1000° C. for. The synthesized tungsten bronze thin films are strongly adhered onto different substrates and composed of densely packed micron size particles.

In one aspect, the present invention is also directed to the process of producing the tungsten bronze film by heating a mixture of alkaline tungstate, tungsten (VI) oxide ($WO_3$), tungsten powder in a furnace under inert atmosphere, e.g., argon, at 700-1000° C., 800-900° C., or 840-890° C.

In certain embodiments, the process of producing the tungsten bronze film includes the steps of, mixing an alkaline tungstate, tungsten (VI) oxide ($WO_3$), tungsten powder, and a solvent to form a slurry; dispensing the slurry onto a surface of a substrate; and heating the substrate with the slurry in a furnace under inert atmosphere at 700-1000° C. for 0.5-10 hours.

In certain embodiments, the process of producing the tungsten bronze film includes the step of cleaning the surface of the substrate before dispensing the slurry onto the surface. Substrates may be cleaned chemically and/or mechanically. For example, substrates may be cleaned according to a general procedure, with a sand paper or scotch brite type material, or plasma. The general cleaning procedure may include the steps of (1) the substrate is first immersed in sodium hydroxide (2.5 M) for 2 minutes, followed by washing with water; (2) the substrate is then immersed in nitric acid (6 M) for 30 seconds, followed by washing with water; and (3) finally, the substrate is immersed in hydrochloric acid (5 M) for 30 seconds, followed by washing with water.

In certain embodiments, the process of producing the tungsten bronze film includes a step of cleaning the tungsten bronze film after heating the substrate with the slurry in a furnace.

In certain embodiments, the process of producing the tungsten bronze film includes the use of sodium tungstate, potassium tungstate, and/or cesium tungstate.

In certain embodiments, the process of producing the tungsten bronze film includes the steps of, mixing an alkaline tungstate, tungsten (VI) oxide ($WO_3$), tungsten powder, and a solvent to form a slurry; sonicating the slurry; dispensing the slurry onto a surface of a substrate; and heating the substrate with the slurry in a furnace under inert atmosphere at 700-1000° C. for 0.5-10 hours. The solvent is not particularly limited, and can be chosen from an organic solvent, such as alcohol and/or dimethyl sulfoxide (DMSO), or water.

In certain embodiments, the process of producing the tungsten bronze film includes adding a dopant to the mixture of alkaline tungstate, tungsten (VI) oxide ($WO_3$), tungsten powder. The dopant is not particularly limited, and can be selected from any transition metal including elements in the d-block of the periodic table, which includes groups 3 to 12 on the periodic table. In certain embodiments, the transition metal is selected from the f-block of the periodic table. In certain specific embodiments, the dopant is Fe, Ni, Co, and/or Ag.

In one aspect, the invention provides a coated substrate comprising a substrate and a tungsten bronze film having densely packed micron size particles, wherein the film thickness in the range of 100µm to 2 mm, the densely packed micron size particles have a particle size in the range of 45 nm-10µm, and the purity of cubic phase of tungsten bronze film is 90% or higher, and wherein the tungsten bronze film is prepared by heating a mixture comprising alkaline tungstate, tungsten (VI) oxide ($WO_3$), and tungsten powder in a furnace under inert atmosphere at 700-1000° C.

Applications

In one aspect, the invention provides the method of using the coated substrate, for example, in industries that require materials having high conductivity, high thermal stability, high mechanical strength, high resistance to strong acids, and/or relatively good resistance to strong bases.

EXAMPLES

The embodiments described above in addition to other embodiments can be further understood with reference to the following examples:

Example 1

Sodium tungsten bronzes are non-stoichiometric compound having the formula of $Na_xWO_3$ ($0<x\leq1$). The films are in-situ synthesized on a substrate, via a precursor deposition followed by heating under inert atmosphere ~865° C. So far, the best film synthesized possesses a conductivity of $5.18\times10^8$ S/m. This conductivity is compared to International Annealed Copper Standard (IACS) that was established in 1913 by International Electrotechnical Commission. The IACS standard value is $5.8\times10^7$ S/m or 100% IACS at 20° C.

Experimental Procedure

A mixture of solid precursors namely, sodium tungstate dihydrate ($Na_2WO_4.2H_2O$), tungsten (VI) oxide $WO_3$), and tungsten powder (W) (3:2:2 molar ratio) are thoroughly ground in an agate mortar and pestle. Iron powder (Fe) (0.1 wt. % w.r.t W) is added to the mixture as a dopant and ground further.

The solid precursor mixture (0.05 g) is dispersed in dimethyl sulfoxide (0.40 g) and sonicated at room temperature for 30 minutes.

Substrates are cleaned according to a general procedure, Scotch Brite cleaning method, or with a sand paper. General cleaning procedure includes, first the substrate is immersed in sodium hydroxide (2.5 M) for 2 minutes, followed by washing with deuterium depleted water (DDW); next, the substrate is immersed in nitric acid (6 M) for 30 seconds, followed by washing with DDW; and lastly, the substrate is immersed in hydrochloric acid (5 M) for 30 seconds, followed by washing with DDW.

The cleaned substrate is placed on a hot plate (~120° C.) and the previously dispersed precursor mixture in dimethyl sulfoxide (DMSO) is slowly added dropwise using a glass Pasteur pipette onto the substrate until he surface is fully covered with the precursor dispersion.

As deposited substrates are placed on a graphite block, see FIG. 1.

Figure 2:
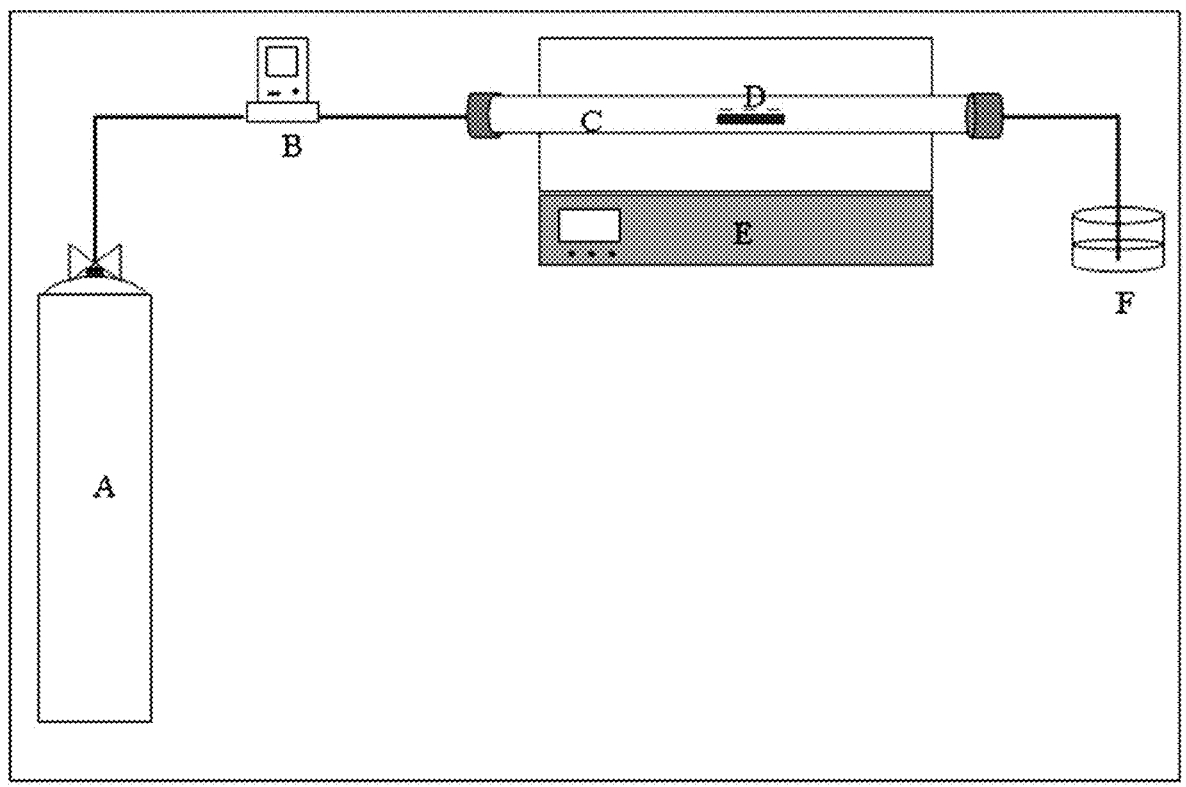
FIG. 2 illustrates a schematic diagram of the experimental setup: A (Argon cylinder), B (mass flow meter), C (Quartz tube (OD=25 mm, ID=22 mm, L=60 cm), D (deposited substrates loaded graphite block), E (programmable tube furnace), F (Oil bubbler).

The graphite block is loaded into a horizontal tube furnace connected to an Argon line as illustrated in FIG. 2.

The substrates are heated at 865C for 1 hour under an inert gas (Argon) atmosphere.

Results

1. Powder X-ray Diffraction Analysis of the in-situ synthesized films

Figure 3:
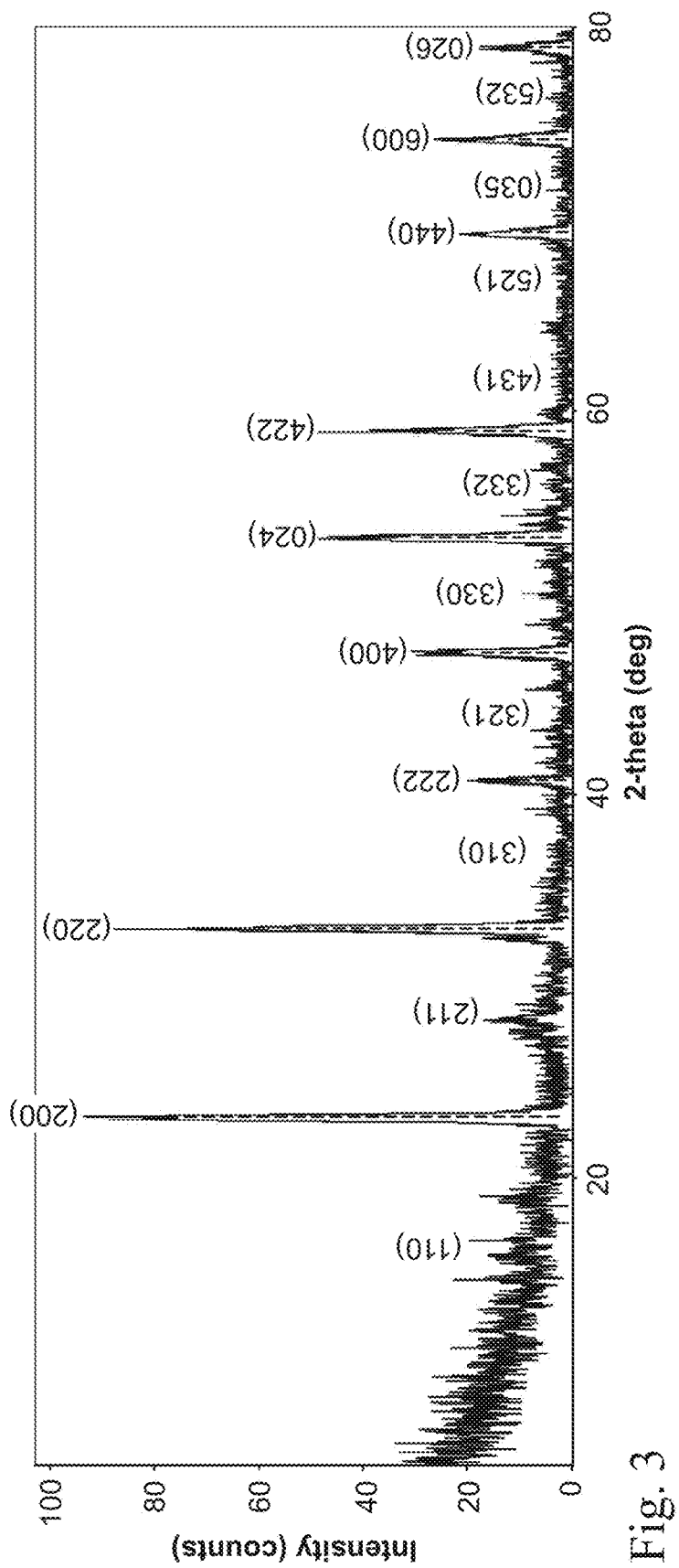
FIG. 3 illustrates a powder X-ray diffraction pattern of as a deposited coating.

The powder X-ray diffraction (PXRD) studies were performed with a Rigaku Ultima IV diffractometer using Cu Kα ($\lambda=0.15406$ nm) radiation. A beam voltage of 40 kV and a beam current of 44 mA were used. The PXRD patterns were collected at 0.02° steps over a 2θ range of 5-80° with a continuous scan rate of 2.0°/min. The sample PXRD pattern is illustrated in FIG. 3, which shows characteristic XRD pattern of cubic sodium tungsten bronze with the formula $Na_{0.54}WO_3$.

2. Scanning Electron Microscopic images of the in-situ synthesized films

Figure 4:
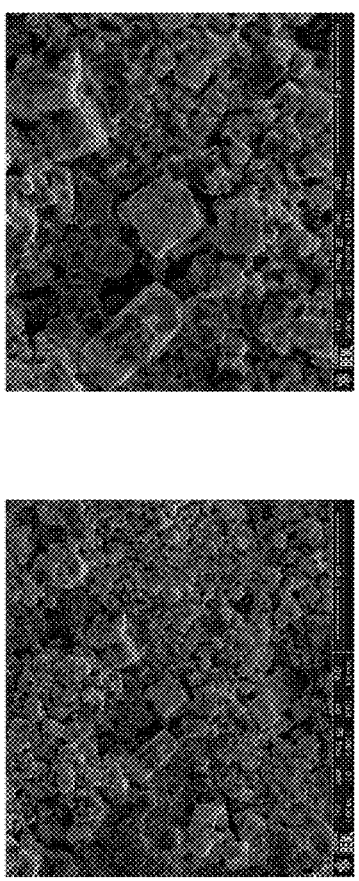
FIG. 4 provides an SEM images of in-situ synthesized highly conductive sodium tungsten bronze film.

The surface morphology of the films was analyzed with FEI Nova Nano SEM 450 instrument. As illustrated in FIG. 4, the material includes micron size particles.

3. Conductivity measurements of the in-situ synthesized films

The conductivity measurements of the films are done using a four-probe method in linear Van der Pauw configuration. Table 1 summarizes the best conductivity values obtained so far.

TABLE 1

Conductivity measurements of the in-situ synthesized sodium tungsten bronze thin films.

| Sample | Film Thickness (mm) | Conductivity (S/m) |
|---|---|---|
| 1 | 0.10 | $5.18 \times 10^8$ |
| 2 | 0.20 | $3.32 \times 10^8$ |
| 3 | 0.25 | $1.16 \times 10^8$ |

INCORPORATION BY REFERENCE

The entire contents of all patents, published patent applications and other references cited herein are hereby expressly incorporated herein in their entireties by reference.

Equivalents

Those skilled in the art will recognize, or be able to ascertain using no more than routine experimentation, many equivalents to the specific embodiments and methods described herein. Such equivalents are intended to be encompassed by the scope of the following claims.

It is understood that the detailed examples and embodiments described herein are given by way of example for illustrative purposes only, and are in no way considered to be limiting to the disclosure. Various modifications or changes in light thereof will be suggested to persons skilled in the art and are included within the spirit and purview of this application and are considered within the scope of the appended claims. For example, the relative quantities of the ingredients may be varied to optimize the desired effects, additional ingredients may be added, and/or similar ingredients may be substituted for one or more of the ingredients described. Additional advantageous features and functionalities associated with the systems, methods, and processes of the present disclosure will be apparent from the appended claims. Moreover, those skilled in the art will recognize, or be able to ascertain using no more than routine experimentation, many equivalents to the specific embodiments of the disclosure described herein. Such equivalents are intended to be encompassed by the following claims.

What is claimed is:

1. A tungsten bronze film comprising micron size particles, wherein
   the tungsten bronze film has a film thickness in the range of 0.01 mm to 2 mm;
   the micron size particles have a particle size in the range of 0.04 μm to 10 μm; and
   the tungsten bronze film has a conductivity of $1\times10^8$ S/m or higher.

2. The tungsten bronze film according to claim 1 having a chemical formula of $Li_xWO_3$, $Na_xWO_3$, $K_xWO_3$, $Cs_xWO_3$, wherein x is 0.4 or higher and 1 or lower.

3. The tungsten bronze film according to claim 1 further comprising a dopant, wherein the dopant is a transition metal element.

4. The tungsten bronze film according to claim 3, wherein the transition metal element is selected from a group consisting of one or more of Fe, Ni, Co and Ag.

5. The tungsten bronze film according to claim 1, wherein the tungsten bronze film has a cubic crystalline phase purity of 95% or higher as characterized by powder x-ray diffraction pattern.

6. The tungsten bronze film according to claim 1, wherein the tungsten bronze film is deposited on a substrate consisting of: copper, glass, steel, porcelain, alumina, iron, or a mixture thereof.

7. The tungsten bronze film according to claim 6, wherein the substrate is copper.

8. The tungsten bronze film according to claim 1, wherein the tungsten bronze film is deposited on a substrate selected from the group consisting of: a metal coated substrate, a plated substrate, or a substrate having a finish of Ag, Ni, Al, Sn, or an alloy thereof.

9. The tungsten bronze film according to claim 2, wherein x is 0.75 or higher and 0.85 or lower.

10. The tungsten bronze film according to claim 2 is $Na_xWO_3$, wherein x is 0.75 or higher and 0.85 or lower.

11. A process of producing the tungsten bronze film according to claim 1 comprising the use of a solution or slurry.

12. The process according to claim 11 comprising the steps of
mixing an alkaline tungstate, tungsten (VI) oxide ($WO_3$), tungsten powder, and a solvent to form a slurry;
dispensing the slurry onto a surface of a substrate; and
heating the substrate with the slurry in a furnace under argon at 700-1000° C. for 0.5-10 hours.

13. The process according to claim 12 further comprising the steps of cleaning the surface of the substrate before dispensing the slurry onto the surface.

14. The process according to claim 12, wherein
the alkaline tungstate is lithium tungstate, sodium tungstate, potassium tungstate, and/or cesium tungstate.

15. The process according to claim 12, wherein
the substrate with the slurry is heated in a furnace at 800-900° C. for 0.5-5 hours.

16. The process according to claim 12, wherein
the substrate with the slurry is heated in a furnace at 840-890° C. for 0.5-2.5 hours.

17. The process according to claim 12, wherein
the alkaline tungstate, tungsten (VI) oxide ($WO_3$), and tungsten powder are further mixed with dopant to form a mixture, and the mixture are grounded before adding into the solvent to form a slurry.

* * * * *